United States Patent
Shimizu et al.

(10) Patent No.: US 7,212,011 B2
(45) Date of Patent: May 1, 2007

(54) CAPACITOR DETERIORATION JUDGMENT METHOD

(75) Inventors: Toshiaki Shimizu, Nara (JP); Toshihiko Oohashi, Osaka (JP)

(73) Assignee: Matsushita Electrid Industrial Co. Ltd., Osaka (JP)

( * ) Notice: Subject to any disclaimer, the term of this patent is extended or adjusted under 35 U.S.C. 154(b) by 0 days.

(21) Appl. No.: 10/564,507

(22) PCT Filed: Jun. 14, 2005

(86) PCT No.: PCT/JP2005/010847

§ 371 (c)(1),
(2), (4) Date: Jan. 12, 2006

(87) PCT Pub. No.: WO2006/003785

PCT Pub. Date: Jan. 12, 2006

(65) Prior Publication Data
US 2006/0220661 A1 Oct. 5, 2006

(30) Foreign Application Priority Data
Jun. 30, 2004 (JP) ............................. 2004-193649

(51) Int. Cl.
*G01R 31/12* (2006.01)
(52) U.S. Cl. ...................... 324/548; 324/649; 324/430; 324/519
(58) Field of Classification Search ................ 324/519, 324/548, 658, 686, 430, 525, 600, 629, 649
See application file for complete search history.

(56) References Cited

U.S. PATENT DOCUMENTS 4,216,424 A * 8/1980 Vette ............................ 324/659
6,151,969 A * 11/2000 Miller et al. .................. 73/808
6,169,395 B1 * 1/2001 King ............................ 324/133
6,285,193 B1 * 9/2001 Kamitani ...................... 324/519

FOREIGN PATENT DOCUMENTS

| JP | 04-142017 | 5/1992 |
| JP | 06-342024 | 12/1994 |
| JP | 08-043507 A | 2/1996 |
| JP | 2001-085283 | 3/2001 |
| JP | 2001-297954 | 10/2001 |
| JP | 2002-267708 | 9/2002 |

OTHER PUBLICATIONS

Japanese Search Report for PCT/JP2005/010847, dated Sep. 27, 2005.
Brian E. Conway, "Electrochemical capacitor and AC Impedance Behavior in Electrochemical System," pp. 393-401, with English translation.

* cited by examiner

*Primary Examiner*—Andrew H. Hirshfeld
*Assistant Examiner*—John Zhu
(74) *Attorney, Agent, or Firm*—RatnerPrestia

(57) ABSTRACT

A method for determining the deterioration of a capacitor that increases the measurement accuracy to have an improved reliability is disclosed. In this method for determining the deterioration of a capacitor, the deterioration of a capacitor including a pair of electrode bodies and electrolytic solution provided between the electrode bodies is determined by applying an AC voltage to the capacitor to measure an impedance characteristic at a frequency of the AC voltage. An inflection point appearing in the impedance characteristic due to the deterioration of the electrolytic solution is previously calculated to make comparison with an impedance value in the frequency region lower than the inflection point, thereby determining the deterioration.

10 Claims, 3 Drawing Sheets

Frequency (Hz)

CAPACITOR DETERIORATION JUDGMENT METHOD

This application is a U.S. national phase application of PCT International Application PCT/JP2005/010847.

TECHNICAL FIELD

The present invention relates to a method for determining the deterioration of a capacitor in which electrolytic solution is provided between electrode bodies.

BACKGROUND ART

As a capacitor in which electrolytic solution is provided between electrode bodies, an electric double layer capacitor (hereinafter also may be simply referred to as capacitor) is known for example. The electric double layer capacitor uses a large electric double layer capacity by a combination of activated carbon that has a large specific surface area of electrode material and that is electrochemically-inactive and electrolyte. The electric double layer capacitor has a characteristic that electrochemical reaction is not caused by the charge and discharge and rapid charge and discharge can be provided with high current, providing a higher power density than that of a chemical battery, for example. The electric double layer capacitor has been expected for the application to a high-current generation circuit, an instant compensation power source, and a load leveling circuit for example.

When the above capacitor is used for a long time, a dry-up mode deterioration proceeds in which the inner electrolytic solution gradually evaporates to consequently increase the internal resistance to reduce the capacitance, thus causing the termination of the service life.

One conventional method determines the deterioration of a capacitor by applying a square wave signal having a low frequency as a measurement signal to a target capacitor to integrate a predetermined part of the reply signal to detect the change of the characteristic of the capacitor based on the integration value. This deterioration determination method is disclosed by Japanese Patent Unexamined Publication No. 6-342024. Another conventional method determines the deterioration of a capacitor by controlling the power distribution of the capacitor to determine the deterioration of the capacitor when the inter-terminal voltage of the capacitor reaches a deterioration reference voltage within a predetermined time from the time at which the inter-terminal voltage reaches a predetermined value. This deterioration determination method is disclosed by Japanese Patent Unexamined Publication No. 2001-297954.

Still another conventional method determines the deterioration of a capacitor by measuring the increase of the temperature at the surface of the capacitor. The above-described deterioration determination method is disclosed by Japanese Patent Unexamined Publication No. 2001-85283. A technique regarding an impedance characteristic of a capacitor is disclosed, for example, by "Denki-Kagaku Capacitor, Kiso, Zairyou, Ouyou (which is written by Brian E. Conway and published by NTS Inc. on Jun. 5, 2001, P. 393 to P. 401).

However, the conventional methods for determining the deterioration of a capacitor may require a circuit section (e.g., measurement signal source, A/D converter) and a signal processing by CPU, thus increasing the cost of the measurement apparatus and complicating the deterioration detection method. The above deterioration determination by the temperature at the surface of the capacitor also may cause a problem in the measurement accuracy.

Furthermore, generally-known conventional methods for determining the deterioration of an electrolysis capacitor may cause a huge amount of accumulated measured data. Thus, a circuit device for determining the deterioration based on the data also may have a high cost and a complicate structure.

Furthermore, when a capacitor in which electrolytic solution is provided between electrode bodies (e.g., electric double layer capacitor) is determined with regards to the deterioration, another method may be considered by which the capacity component and a DC capacitor resistance (hereinafter referred to as DCR) component are measured and the determination is made based on the measurement result. For the measurement of these capacity component and DCR component, a DC voltage method and an AC impedance method are known. The DC voltage method measures these capacity component and DCR component based on the behavior of the DC voltage when the capacitor performs charging and discharging. The AC impedance method applies an AC voltage to the capacitor to derive these capacity component and DCR component from the impedance value.

The DC voltage method provides an accurate measurement result because this method directly measures these capacity component and DCR component from the DC voltage in the charging and discharging but uses a large amount of charge in the capacitor due to the charging and discharging. Thus, the DC voltage method may cause a situation where much power is consumed for the determination of the deterioration. The AC impedance method consumes less power because this method uses the frequency characteristic of the AC voltage. However, the AC impedance method may cause, when the deterioration of the capacitor is promoted, a value that is smaller than that of the DC voltage method. This may cause a situation where this value is mistakenly determined as representing no deterioration, thus lowering the reliability.

SUMMARY OF THE INVENTION

The present invention provides a method for determining the deterioration of a capacitor by the AC impedance method having an improved reliability by an increased measurement accuracy.

In the method for determining the deterioration of a capacitor of the present invention, the deterioration of a capacitor including a pair of electrode bodies and electrolytic solution provided between the electrode bodies is determined by applying an AC voltage to the capacitor to measure an impedance characteristic at a frequency of the AC voltage. An inflection point appearing in the impedance characteristic due to the deterioration of the electrolytic solution is previously calculated to compare a characteristic value based on an impedance value in a frequency region lower than the inflection point with a predetermined characteristic value, thereby determining the deterioration. This method can improve the measurement accuracy in the determination of the deterioration of the capacitor and can suppress power consumed for the determination.

Figure 1:
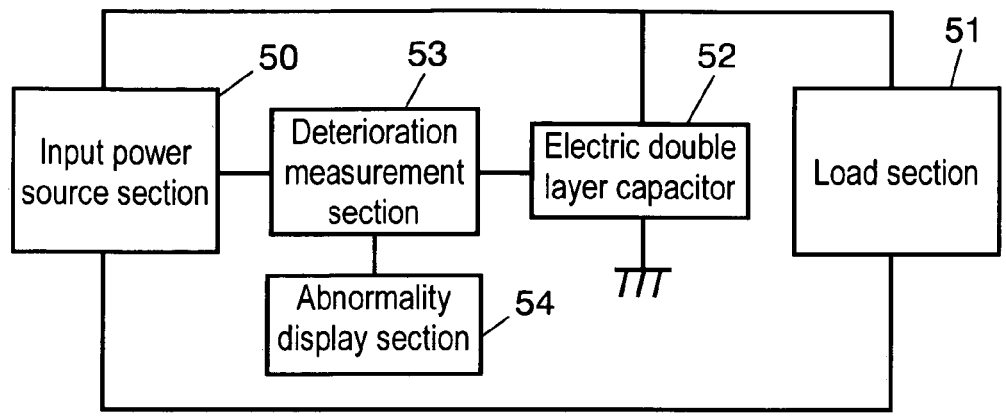
FIG. 1 is a circuit diagram illustrating a method for determining the deterioration of a capacitor according to a first embodiment of the present invention.

| Reference marks in the drawings | |
|---|---|
| 1 | Electrode body |
| 1a | Power collection material |
| 1b | Activated carbon |
| 2 | Separator |
| 3 | Electrolytic solution |
| 4 | Housing |
| 5 and 26 | Lead terminal |
| 6 and 24 | Sealing body |
| 7, 8, and 11 | Characteristic impedance trajectory |
| 10 | Diffusion resistance component |
| 12, 15, and 16 | Inflection point |
| 13 | DCR measurement frequency region |
| 14 | Capacitative frequency region |
| 20 | Capacitor element |
| 21 | Electrode terminal |
| 22 | Adhesive tape |
| 23 | Metal case |
| 25 | Concave groove |
| 27 | Grommet fitting |
| 28 and 52 | Electric double layer capacitor |
| 50 | Input power source section |
| 51 | Load section |
| 53 | Deterioration measurement section |
| 54 | Abnormality display section |

DETAILED DESCRIPTION OF PREFERRED EMBODIMENTS

Hereinafter, embodiments of the present invention will be described with reference to the drawings.

(First Embodiment)

FIG. 1 is a circuit diagram illustrating a method for determining the deterioration of a capacitor according to a first embodiment of the present invention. In FIG. 1, input power source section 50 applies a voltage to load section 51 so that load section 51 operates. A part of the voltage charges electric double layer capacitor 52. When input power source section 50 has an abnormality or requires high power, capacitor 52 supplies power to load section 51. Capacitor 52 deteriorates when being used for a long time or being used in some environment. Deterioration measurement section 53 determines the deterioration of capacitor 52 by measuring the deterioration. When the deterioration is determined, abnormality display section 54 reports the deterioration by alarm, display or the like.

Electric double layer capacitors for explaining the method for determining the capacitor deterioration according to embodiments of the present invention have a coin-like shape for memory backup and a cylindrical shape for power. The coin-type electric double layer capacitor (not shown) is provided by sequentially layering a lower discoidal electrode, a separator, and an upper electrode in a short cylindrical metal case in which the upper end is opened to inject electrolytic solution into the case. Gasket for the purpose of insulation and sealing is stored at the inner circumference edge section of the metal case. The upper face of the metal case is covered with a metal cover. The metal case and the metal cover are caulked so that the former does not have a direct contact with the latter.

Figure 6:
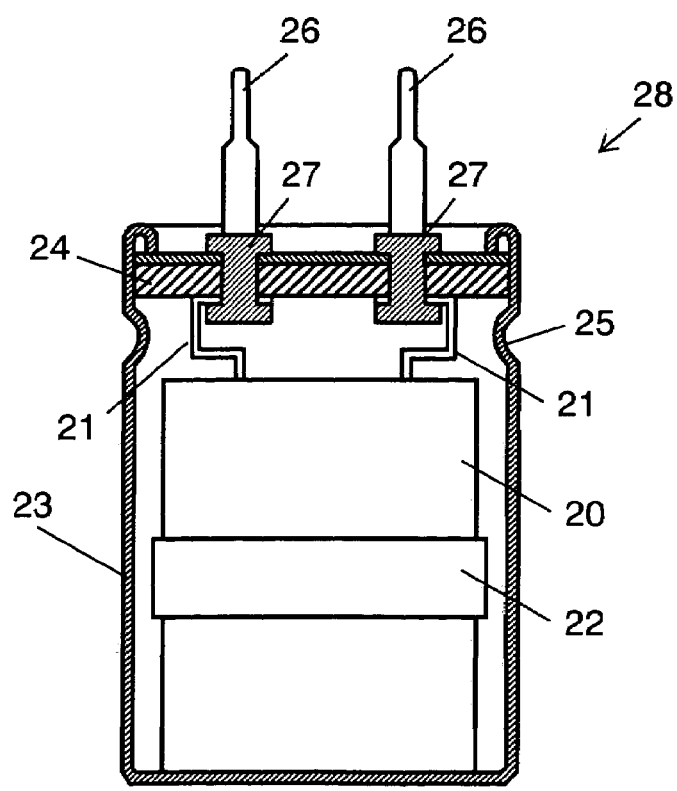
FIG. 6 is a cross-sectional view of an electric double layer capacitor for explaining the method for determining the deterioration of a capacitor according to the embodiment of the present invention.

FIG. 6 shows the structure of a cylindrical electric double layer capacitor for explaining the method for determining the deterioration of the capacitor according to an embodiment of the present invention. In FIG. 6, electric double layer capacitor 28 has the structure as described below. Power collection material in capacitor element 20 includes long stripe-shaped metal foil, punching metal, expand metal for example. Both faces or one face of this power collection material are/is coated with polarized electrode consisting of activated carbon, carbon, and binder. Two power collection materials coated in the manner as described above are prepared. These power collection materials also have therebetween a long stripe-shaped separator for the purpose of insulation and the retention of electrolytic solution. Each power collection material is connected with one electrode terminal 21. Then, capacitor element 20 is structured by winding the power collection materials in a spiral manner to finally fix the power collection materials by adhesive tape 22. Electrode terminal 21 of capacitor element 20 is connected to grommet fitting 27 provided in sealing body 24. Metal case 23 has a cylindrical shape with a bottom in which the neighborhood of the upper end section has concave groove 25. Lead terminal 26 is outwardly extruded from metal case 23 in which capacitor element 20 is stored. Electrolytic solution (not shown) is injected to metal case 23 and the upper end section of metal case 23 is inwardly bent, thereby sealing metal case 23.

Figure 2:
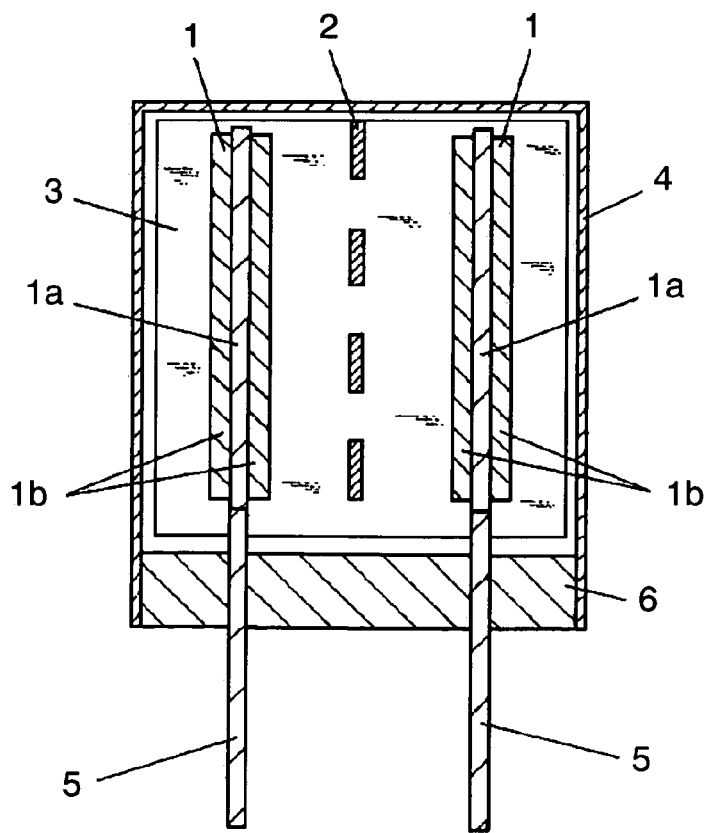
FIG. 2 is a cross-sectional view illustrating a method for determining the deterioration of a capacitor according to the first embodiment of the present invention.

FIG. 2 is a cross-sectional view illustrating another capacitor for explaining the determination of the deterioration of a capacitor in an embodiment of the present invention. This capacitor includes electrode bodies 1 and electrolytic solution 3 provided between electrode bodies 1. Housing 4 is filled with electrolytic solution 3. Housing 4 includes electrode bodies 1, separator 2 provided between electrode bodies 1, lead terminals 5 respectively connected to electrode bodies 1, and sealing body 6 for sealing housing 4. Electrode body 1 is provided by covering the wall face of power collection material 1a consisting of metal such as aluminum with activated carbon 1b. Separator 2 also may be omitted when electrolytic solution 3 has a high viscosity (e.g., when electrolytic solution 3 has gel-like texture).

The determination of the deterioration of a capacitor according to the first embodiment of the present invention is performed by using deterioration measurement section 53 to make the determination by the measurement by the AC impedance method. Although the AC impedance method can provide a measurement with a significant power saving, it is important to increase the measurement accuracy to improve the credibility of the measurement result.

Figure 3:
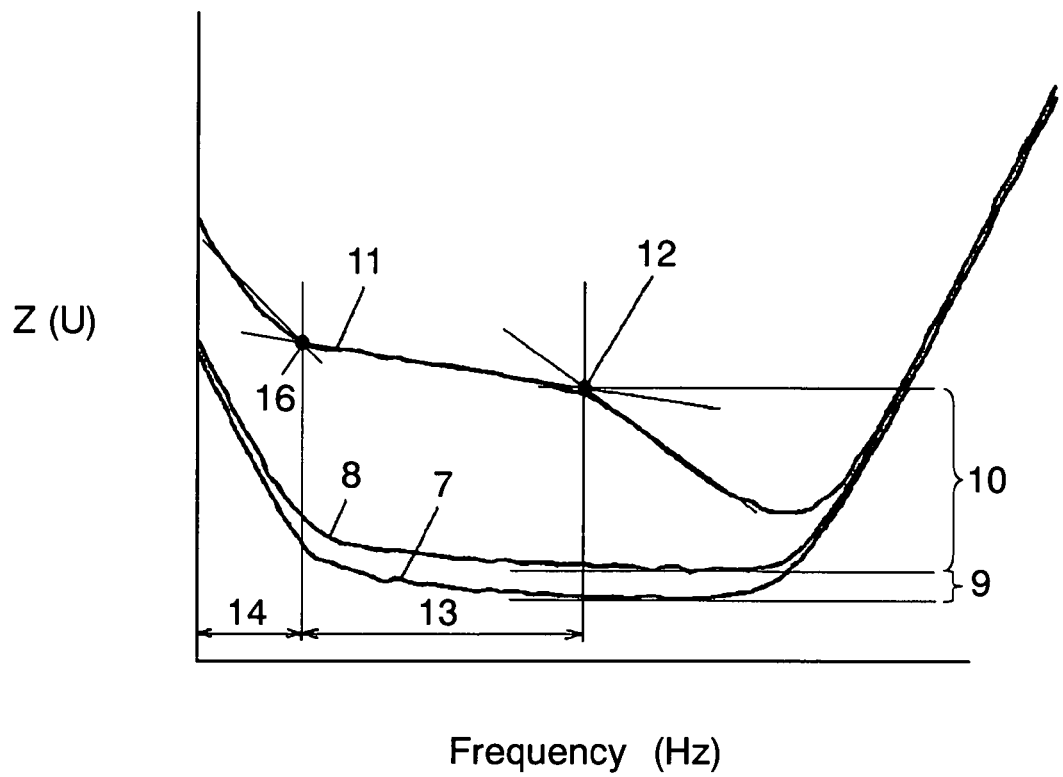
FIG. 3 illustrates an impedance characteristic of the capacitor.

FIG. 3 illustrates the impedance characteristic of the capacitor according to the first embodiment of the present invention. The capacitor according to the first embodiment is applied with an AC voltage and the impedance characteristic at the frequency of the AC voltage is measured. In FIG. 3, the vertical axis represents impedance values while the horizontal axis represents frequencies when a fixed AC voltage is applied to the capacitor. Both of the vertical axis and horizontal axis are logarithmic axes. The impedance characteristic at the initial stage of the use of the capacitor according to the first embodiment draws characteristic impedance trajectory 7. When this capacitor is used, a resistance component of constituting components of the capacitor themselves (i.e., electrolytic solution 3, activated carbon 1b, power collection material 1a), which is known as so-called equivalent series resistance (ESR) 9, is increased. As a result, the impedance characteristic draws trajectory 8.

When the capacitor is further used, the equivalent series resistance is further increased to cause deteriorated material of electrolytic solution 3 to appear in electrolytic solution 3. Then, the deteriorated material is attached to the surface of activated carbon 1b and/or separator 2. Thereafter, resistance component to ion movement, which is known as so-called diffusion resistance component 10, is formed, thus causing the impedance characteristic to draw trajectory 11 having inflection point 12 caused by the deterioration of the electrolytic solution.

In view of the existence of inflection point 12, the present invention determines the deterioration by an impedance value within frequency region 13 that is lower than convex inflection point 12 at the upper side and that is higher than another convex inflection point 16 at the lower side. However, another inflection point 16 is inflection point at which region 14 changes to region 13. At region 14, an impedance value rapidly changes from the frequency of 0(zero). At region 13, an impedance value gradually decreases. By doing this, the method for determining the deterioration of a capacitor according to the first embodiment can provide a result having a high accuracy that is substantially the same as that of the measurement result obtained from the DC voltage method and can realize a power-saving measurement which is an advantage of the AC impedance method.

Figure 4:
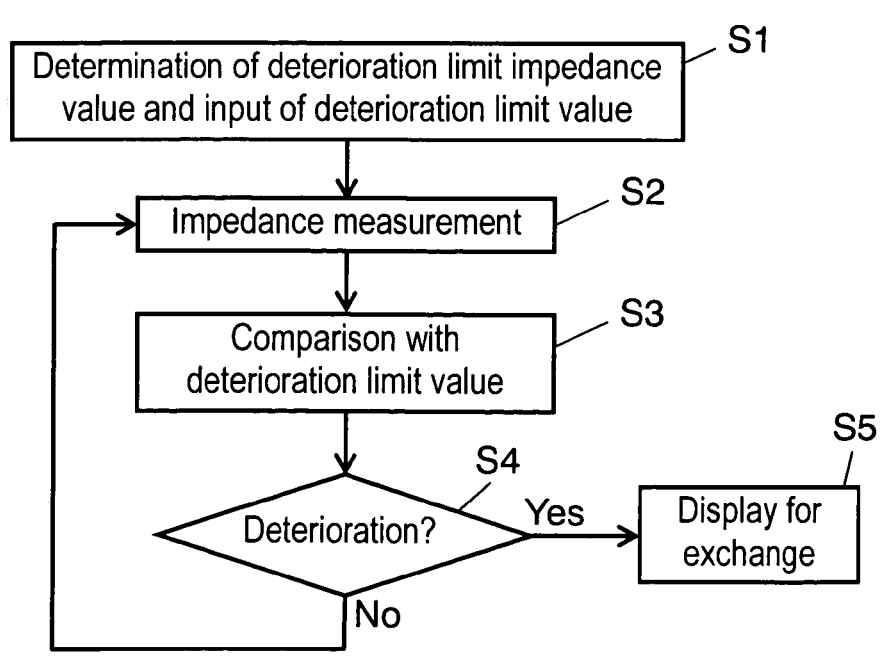
FIG. 4 is a flow diagram of the deterioration determination method.

FIG. 4 is a flow diagram illustrating steps of the method for determining the deterioration of a capacitor according to the first embodiment of the present invention.

First, a deterioration characteristic of the same type of an electric double layer capacitor as that of capacitor 52 to be used is obtained. According to the first embodiment, a capacitor for which the deterioration characteristic is desired to be obtained is applied with a load (2.0V to 2.5V) at a temperature of 50 degrees C. After 10000 to 15000 hours, the impedance characteristic is measured. This deterioration characteristic also can be measured with a shorter time by further increasing the temperature.

Based on this impedance characteristic at which the deterioration is caused, inflection point 12 caused due to the deterioration of electrolytic solution is calculated. Then, a frequency lower than inflection point 12 is decided as a measurement frequency. This frequency and the impedance value are stored in deterioration measurement section 53. Based on the product design of a circuit including capacitor 52, a deterioration limit impedance value of capacitor 52 is determined and is stored in deterioration measurement section 53 (S1).

Then, when the circuit including capacitor 52 is operated, capacitor 52 gradually deteriorates. During the operation of the circuit, an AC voltage is applied to capacitor 52 whenever a predetermined time is reached, thereby measuring an impedance value with a predetermined frequency (S2).

Then, the measured impedance value is compared with the deterioration limit impedance value previously stored in the deterioration measurement section 53 (S3). When the measured impedance value is equal to or lower than the deterioration limit impedance value, then no abnormality is determined (S4: No) and capacitor 52 is continuously used.

When the measured impedance value exceeds the deterioration limit impedance value on the other hand, capacitor 52 is determined as being deteriorated (S4: Yes) and abnormality display section 54 displays a request for the exchange of the capacitor by a warning light or the like (S5).

As described above, the method for determining the deterioration of a capacitor according to the first embodiment determines the deterioration of the capacitor based on an impedance value in frequency region 13 lower than inflection point 12 of the impedance characteristic. By doing this, the deterioration of the capacitor can be determined with a high accuracy, improving the determination reliability and saving the power used for the measurement.

When the deterioration of the capacitor is determined by measuring an impedance at a frequency higher than inflection point 12 of the AC impedance characteristic, the impedance value is low as shown in FIG. 3 even when the capacitor is deteriorated. Thus, the determination of the deterioration of the capacitor may include a significant error, causing a poor accuracy of the determination of the deterioration.

It is noted that FIG. 1 illustrates a basic circuit when electric double layer capacitor 52 is used according to the first embodiment and the present invention is not limited to this circuit configuration.

(Second Embodiment)

Figure 5:
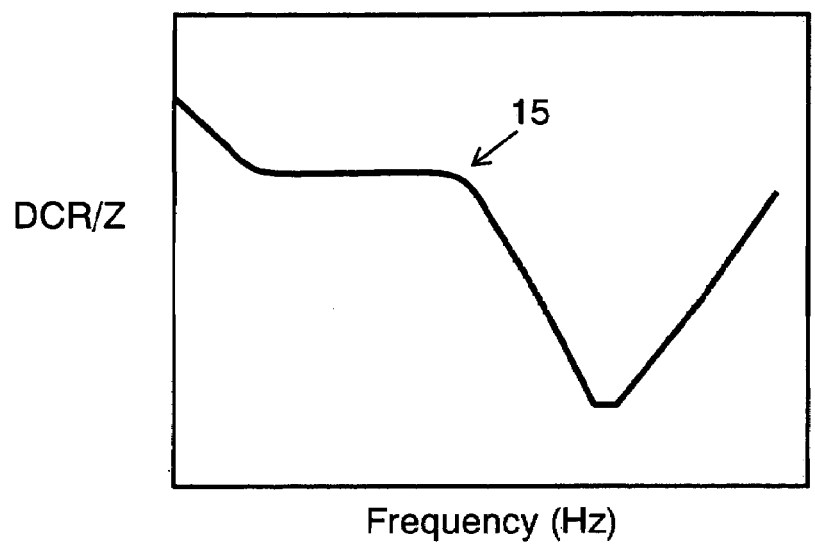
FIG. 5 is a characteristic diagram illustrating the DCR/Z ratio of the deterioration limit of the capacitor for explaining the method for determining the deterioration of a capacitor according to a second embodiment of the present invention.

In the method for determining the deterioration of a capacitor according to the second embodiment of the present invention, with regards to a capacitor deterioration limit characteristic, the DCR is firstly measured by the DC voltage method. Next, the method similar to that according to the first embodiment is used to measure a deterioration limit AC impedance characteristic (hereinafter referred to as Z). Then, a correlation between the previously obtained DCR and Z is calculated. FIG. 5 illustrates the capacitor deterioration limit DCR/Z ratio according to the second embodiment of the present invention. In FIG. 5, the vertical axis and the horizontal axis are both logarithmic axes.

Based on FIG. 5, the DCR/Z ratio at a frequency lower than inflection point 15 at the capacitor deterioration limit is obtained and is stored in deterioration measurement section 53. Then, when the circuit including capacitor 52 is operated as in the case according to the first embodiment, capacitor 52 gradually deteriorates. During the operation of the circuit, an AC voltage is applied to the capacitor whenever a predetermined time is reached, thereby measuring Z at a predetermined frequency and measuring DCR. When the measured DCR/Z ratio is equal to or lower than the deterioration limit DCR/Z ratio previously stored in deterioration measurement section 53, the capacitor is determined as having no deterioration and is used continuously. When the measured DCR/Z ratio exceeds the deterioration limit DCR/Z ratio, then the capacitor is determined as being deteriorated and the deterioration is displayed by a warning light or the like.

As described above, the method for determining the deterioration of a capacitor according to the second embodiment can increase the measurement accuracy of the AC impedance method, improving the reliability of the determination.

(Third Embodiment)

The method for determining the deterioration of a capacitor according to the third embodiment of the present invention will be described with reference to FIG. 3. In FIG. 3, region 14 in which a capacitor impedance value rapidly increases from the frequency of 0(zero) is a capacitative frequency region representing a capacity component of a power gradient due to the self-discharge of the capacitor. Capacitative frequency region 14 can be used to determine the deterioration of the capacitor.

According to the third embodiment, the self-discharge can be used to suppress power consumed for determining the deterioration of the capacitor.

In order to increase the accuracy, an impedance value measurement using the AC impedance method or a capacity component measurement using the self-discharge of a capacitor in the present invention is desirably performed when the capacitor is not used and thus the voltage fluctuation is small.

Recently, this electric double layer capacitor has been suggested to be used as a power source for a vehicle such as a fuel cell vehicle. Power consumption by a power source is desired to be suppressed as much as possible particularly in the case of an in-vehicle power source having a limited capacity. The impedance value measurement using the AC impedance method and the capacity component measurement by the capacitor self-discharge as described above are effective in the field as described above. In order to further improve the accuracy for determining the deterioration, the above measurement for an in-vehicle power source is also desirably performed when the capacitor is not used and thus the voltage fluctuation is small.

Although the third embodiment has described a case in which the capacitor is an electric double layer capacitor, the present invention is not limited to the third embodiment. The same effect also can be provided when the capacitor including a pair of electrode bodies having electrolytic solution therebetween is a redox capacitor.

INDUSTRIAL APPLICABILITY

The method for determining the deterioration of a capacitor in which electrolytic solution is provided between electrode bodies according to the present invention has an effect of saving power and is particularly useful when being used in a vehicle that is required to have a smaller size for example.

The invention claimed is:

1. A method for determining a deterioration of a capacitor, the capacitor including a pair of electrode bodies and an electrolytic solution provided between the electrode bodies, the method comprising the steps of:
measuring a characteristic value of the capacitor by applying an AC voltage to the capacitor at a measurement frequency; and
comparing the measured characteristic value with a predetermined characteristic value to determine the deterioration of the capacitor, the predetermined characteristic value selected from a predetermined impedance characteristic at the measurement frequency, the predetermined impedance characteristic corresponding to the deterioration of the electrolytic solution,
displaying the deterioration of the capacitor on a display based on the comparison,
wherein the measurement frequency is selected to be less than a frequency corresponding to an inflection point formed in the predetermined impedance characteristic.

2. The method according to claim 1, wherein the inflection point is a first inflection point having a convex shape in a direction of increasing impedance, the frequency is a first frequency and the predetermined impedance characteristic includes a second inflection point having a convex shape in a direction of decreasing impedance, the second inflection point being located at a second frequency that is less than the first frequency.

3. The method according to claim 2, wherein the measurement frequency is selected from between the first frequency and the second frequency.

4. The method according to claim 1, wherein the predetermined impedance characteristic is calculated based on a correlation between a deterioration impedance characteristic and a predetermined DC capacitor resistance, the deterioration impedance characteristic calculated by deteriorating a same type of capacitor,
the step of measuring the characteristic value includes measuring a DC capacitor resistance value of the capacitor using the applied AC voltage at the measurement frequency, and
the step of comparing the measured characteristic value includes calculating a ratio between the measured DC capacitor resistance value and the measured characteristic value, the ratio being compared with the predetermined characteristic value.

5. The method according to claim 2, wherein a frequency region that is less than the second frequency corresponds to a region of the predetermined impedance characteristic representing a capacity component associated with a voltage change due to a self-discharge of the capacitor and the measurement frequency is selected from within the frequency region.

6. A method for reporting a deterioration of a capacitor mounted in an electrical apparatus including a display, the method comprising the steps of:
measuring a characteristic value of the capacitor by applying an AC voltage to the capacitor at a measurement frequency;
comparing the measured characteristic value with a predetermined impedance characteristic at the measurement frequency, the predetermined impedance characteristic corresponding to a deterioration of an electrolytic solution of the capacitor at the measurement frequency; and
displaying the deterioration of the capacitor on the display based on the comparison,
wherein the measurement frequency is selected to be less than a frequency corresponding to an inflection point in the predetermined impedance characteristic.

7. The method according to claim 6, wherein the predetermined impedance characteristic is calculated based on a correlation between a deterioration impedance characteristic and a predetermined DC capacitor resistance, the deterioration impedance characteristic calculated by deteriorating a same type of capacitor,
the step of measuring the characteristic value includes measuring a DC capacitor resistance value of the capacitor using the applied AC voltage at the measurement frequency, and
the step of comparing the measured characteristic value includes calculating a ratio between the measured DC capacitor resistance value and the measured characteristic value, the ratio being compared with the predetermined impedance characteristic value at the measurement frequency.

8. The method according to claim 6, wherein the inflection point is a first inflection point having a convex shape in a direction of increasing impedance, the frequency is a first frequency and the predetermined impedance characteristic includes a second inflection point having a convex shape in a direction of decreasing impedance, the second inflection point being located at a second frequency that is less than the first frequency.

9. The method according to claim 8, wherein the measurement frequency is selected from between the first frequency and the second frequency.

10. The method according to claim 8, wherein a frequency region that is less than the second frequency corresponds to a region of the predetermined impedance characteristic representing a capacity component associated with a voltage change due to a self-discharge of the capacitor and the measurement frequency is selected from within the frequency region.

* * * * *

UNITED STATES PATENT AND TRADEMARK OFFICE
CERTIFICATE OF CORRECTION

PATENT NO. : 7,212,011 B2  Page 1 of 1
APPLICATION NO. : 10/564507
DATED : May 1, 2007
INVENTOR(S) : Toshiaki Shimizu et al.

It is certified that error appears in the above-identified patent and that said Letters Patent is hereby corrected as shown below:

<u>Title Page, Item (73) Assignee</u>
Change "Matsushita Electrid Industrial Co. Ltd."
To -- Matsushita Electric Industrial Co. Ltd. --

Signed and Sealed this

Thirty-first Day of July, 2007

JON W. DUDAS
*Director of the United States Patent and Trademark Office*